United States Patent [19]

Ham

[11] Patent Number: 5,514,500

[45] Date of Patent: May 7, 1996

[54] HALF-TONE TYPE PHASE SHIFT MASK AND METHOD FOR FABRICATING THE SAME

[75] Inventor: Young M. Ham, Ichon, Rep. of Korea

[73] Assignee: Hyundai Electronics Industries Co., Ltd., Rep. of Korea

[21] Appl. No.: 366,258

[22] Filed: Dec. 29, 1994

[30] Foreign Application Priority Data

Dec. 31, 1993 [KR] Rep. of Korea ................... 93-31824

[51] Int. Cl.$^6$ ........................................................ G03F 9/00
[52] U.S. Cl. ............................ 430/5; 430/322; 430/323; 430/324
[58] Field of Search ..................... 430/5, 322, 323, 430/324

[56] References Cited

U.S. PATENT DOCUMENTS 5,409,789  4/1995  Ito ................................................. 430/5

Primary Examiner—S. Rosasco
Attorney, Agent, or Firm—Merchant, Gould, Smith, Edell, Welter and Schmidt

[57] ABSTRACT

There is disclosed a half-tone type phase shift mask comprising a transparent substrate on which a phase shift pattern and a chrome pattern, both provided with a window, are laminated in sequence, said window exposing a predetermined area of said transparent substrate therethrough, and said chrome pattern having a step near the window which is so thick as to permit penetration of only about 5 to 50% of an incident beam of light illuminated on said half-tone type phase shift mask. Such half-tone type phase shift mask is fabricated by: forming a phase shift layer on a transparent substrate; forming a light screen on the phase shift layer; selectively etching the light screen and the phase shift layer in sequence, to form a light screen pattern and a phase shift pattern, both provided with a window exposing a predetermined area of the transparent substrate; and removing the light screen pattern near said window at a predetermined thickness, to form a step near said window. It is capable of preventing the penetration of light at unintended areas, and thus is capable of providing a photosensitive pattern superior in smooth profile.

6 Claims, 3 Drawing Sheets 005,514,500

HALF-TONE TYPE PHASE SHIFT MASK AND METHOD FOR FABRICATING THE SAME

BACKGROUND OF THE INVENTION

1. Field of the Invention

The present invention relates, in general, to a method for fabricating a half-tone type phase shift mask, capable of preventing the penetration of light at unintended areas, and thus capable of obtaining a photosensitive pattern superior in smooth profile.

2. Description of the Prior Art

High integration in semiconductor devices has generally required that wires be reduced in size and that the distance between wires and unit devices, such as transistors and capacitors, become smaller. As a result, the number of steps involved in fabricating a highly integrated semiconductor are increased.

A typical photolithography process for semiconductor devices employs a mask comprising a transparent substrate, such as quartz, on which light screen patterns are formed. However, it is difficult to form a fine pattern smaller than the light resolution by using a typical mask. Indeed, it is virtually impossible to obtain fine patterns with a line width of 0.5 μm or less by using current photosensitive solutions and light exposing equipments.

Meanwhile, very highly integrated semiconductor devices, such as 64 M or more DRAM, demand fine patterns of 0.4 μm or less. Various efforts have been made to meet such demands. In an effort to develop highly integrated semiconductor devices, a phase shift mask was developed.

A phase shift mask is comprised broadly of a quartz substrate, light screen patterns and a phase shift material layer. The phase shift material layer is formed along with the light screen patterns on the quartz substrate, playing a role of shifting a beam of light at an angle of 180°. Such phase shift mask is designed to keep constant the amplitude of a beam of light illuminated on a wafer in light exposure processes and to minimize the exposure caused by interference between a light passing through the phase shift material layer and a light passing through the adjacent quartz substrate, thereby improving the resolution of the photosensitive film pattern.

Of phase shift masks, a half-tone type phase shift mask is utilized to form contact hole patterns, and its process capability is proved to be better by 50% or more than other conventional phase shift masks. In processes for fabricating a semiconductor device, the half-tone type phase shift mask is especially useful in forming fine contact holes of 64 M or more scale.

In order to better understand the background of the present invention, a conventional half-tone type phase shift mask will be described in connection with FIGS. 1 and 2.

First, referring to FIG. 1, there is shown a cross section of a conventional phase shift mask. As shown in this figure, the conventional phase shift mask comprises a quartz substrate 11 on which a light screen pattern 13 along with a phase shift film pattern 15 are formed so as to provide a window 12 exposing the quartz substrate 11 therethrough. The light screen patterns 13 are made of chrome or chrome oxide and have such a thickness so as to permit penetration of about 5 to 10% of an incident light. The phase shift film pattern 15 is made of an oxide, nitride or SOG with a predetermined thickness.

When a light is illuminated on such a half-tone type phase shift mask, the intensity of light is maximized at the central area of the window 12 and reduced to zero at the edge area of the window, as shown in FIG. 2. This drawing also indicates that the intensity of light at areas provided with no window is, although very weak, detected. This is attributed to the fact that the light penetrates through the light screen pattern 13. Of course, the intensity of the passing-through light is proportional to that of a light source. In addition, the intensity of light is not constant but different at the areas in which a window is not provided, as shown in FIG. 2.

When a positive photosensitive film coated on a semiconductor substrate is illuminated by use of such a conventional half-tone type phase shift mask, the area which is intended not to be patterned becomes illuminated because of the penetration of light through the light screen and thus, patterned after development. As a result, a photosensitive film pattern having an uneven surface is obtained. This uneven surface is due to the fact that the incident light passes through the light screen into the unintended areas and the intensity of the passing light is different according to the unintended areas. That is to say, the photosensitive film pattern is formed at the desired height at the edge area by virtue of no intensity of light, but since the photosensitive film of the unintended areas is illuminated by weak and variable intensities of the passing light, the photosensitive film is removed at different thicknesses according to areas when developing.

Such a photosensitive film pattern with an uneven surface is a factor which decreases the production yield and reliability of a semiconductor device. For example, when the conventional photosensitive film pattern is used as an etching mask or an ion implantation mask, a layer under the mask may be damaged or ions may be implanted into unnecessary areas.

SUMMARY OF THE INVENTION

Therefore, an object of the present invention is to overcome the above problems encountered in the prior art and to provide a half-tone type phase shift mask, capable of preventing the penetration of light at unintended areas, and thus capable of obtaining a photosensitive pattern superior in smooth profile.

Another object of the present invention is to provide a method for fabricating the half-tone type phase shift mask.

In accordance with an aspect of the present invention, the above object can be accomplished by providing a half-tone type phase shift mask, comprising a transparent substrate on which a phase shift pattern and a chrome pattern, both provided with a window, are laminated in sequence, the window exposing a predetermined area of the transparent substrate therethrough, and the chrome pattern having a step near the window which is so thick as to penetrate thereunto only about 5 to 50% of an incident beam of light illuminated on the half-tone type phase shift mask.

In accordance with another aspect of the present invention, there is provided a method for the fabrication of a half-tone type phase shift mask, comprising the steps of: forming a phase shift layer on a transparent substrate; forming a light screen on the phase shift layer; selectively etching the light screen and the phase shift layer in sequence, to form a light screen pattern and a phase shift pattern, both provided with a window exposing a predetermined area of the transparent substrate; and removing the light screen pattern near the window at a predetermined thickness, to form a step near the window.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1:
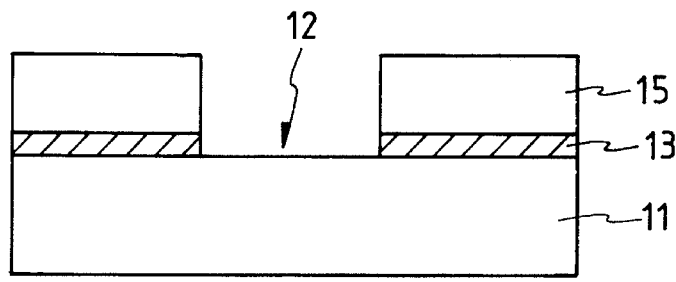
FIG. 1 is a schematic cross sectional view showing a conventional half-tone type phase shift mask.
Figure 2:
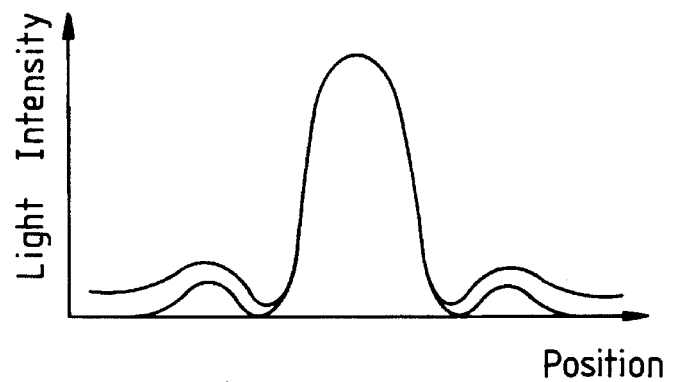
FIG. 2 is a graph showing the intensity of light passing through the half-tone type phase shift mask of FIG. 1 by the positions thereof.

The application of the preferred embodiments of the present invention is best understood with reference to the accompanying drawings, wherein like reference numerals are used for like and corresponding parts, respectively.

Figure 3:
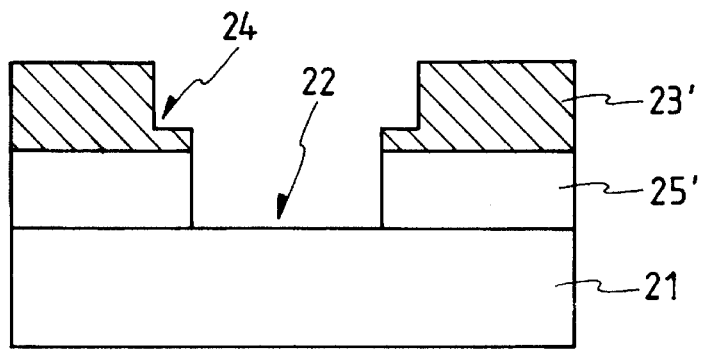
FIG. 3 is a schematic cross sectional view showing a half-tone type phase shift mask according to the present invention.

Referring primarily to FIG. 3, there is shown a half-tone type phase shift mask of the present invention. As shown in this figure, the half-tone type phase shift mask is comprised of a transparent substrate 21 on which a chrome pattern 23' and a phase shift pattern 25' are laminated in sequence, differently from the conventional half-tone type phase shift mask. In the present half-tone type phase shift mask, the chrome pattern 23' and the phase shift pattern 25' are formed in such a way that a window 22 is provided. The chrome pattern 23' is so thick so as not to permit penetration light and is removed in a predetermined thickness near the window 22, to form a step 24 as shown in this figure.

Figure 4:
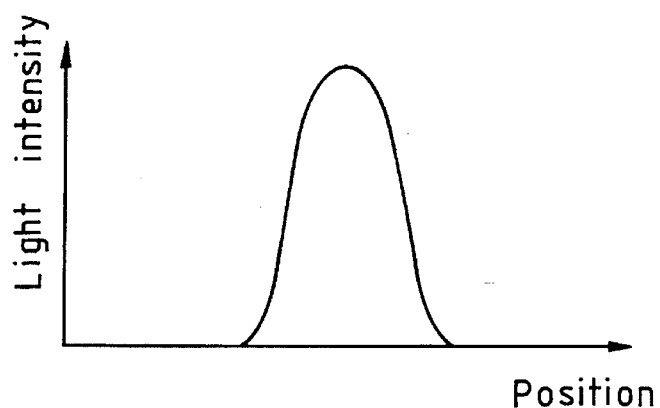
FIG. 4 is a graph showing the intensity of light passing through the half-tone type phase shift mask of FIG. 3 by the positions thereof.

With reference to FIG. 4, there is plotted the intensity of a beam of light passing through the phase shift mask of FIG. 3, by positions of the mask. Unlike the conventional phase shift mask, it is capable of preventing the penetration of light at areas in which window is absent, as shown in this plot. Accordingly, when a light exposure process is undertaken with the half-tone type phase shift mask of the present invention, a pattern with a smooth surface can be obtained.

FIG. 5 shows the preferred process steps of the half-tone type phase shift mask of FIG. 3. These steps will be generally described in connection with FIGS. 5A through 5D.

Figure 5A:
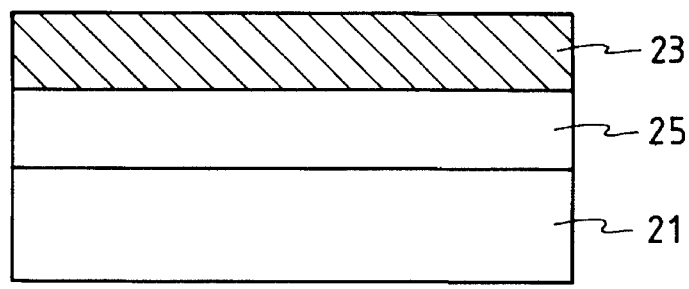
FIGS. 5A through 5D are schematic cross sectional views illustrating a method for the fabrication of a half-tone type phase shift mask, according to the present invention.

First, as shown in FIG. 5A, on a transparent substrate 21, for example, quartz substrate, there are formed in sequence a phase shift layer 25 made of oxide, nitride or photosensitive material and a chrome layer 23. The chrome layer 23 is formed thick enough to prevent light from penetrating itself.

Figure 5B:
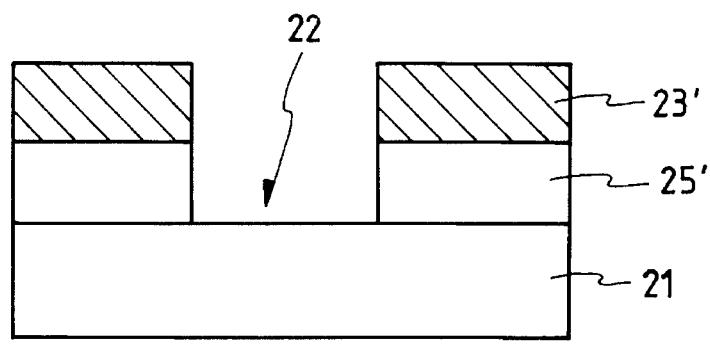

Next, with reference to FIG. 5B, the chrome layer 23 and the phase shift layer 25 are subjected to photolithography, to form a chrome pattern 23' and a phase shift pattern 25' which are both provided with a window 22 exposing a predetermined area of the substrate 21.

Figure 5C:
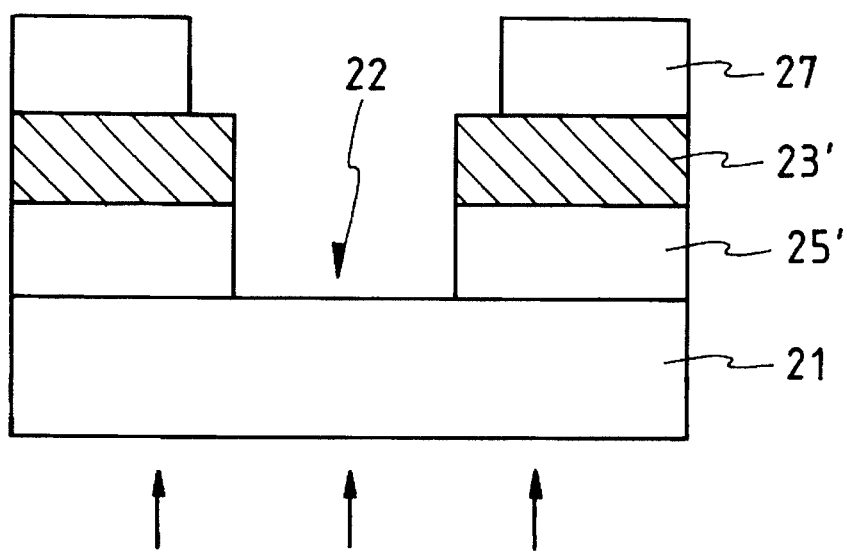

Thereafter, with reference to FIG. 5C, a positive photosensitive film is coated on the chrome pattern 23', then exposed to a beam of light incident from the backside of the transparent substrate 21, and finally developed, to form a photosensitive film pattern 27 having a hole wider than the window 2. That is to say, this photolithography process utilizes the window as a slit from which the beam is diffracted in addition to employing the phase shift pattern 25' and the chrome pattern 23' as a mask. By virtue of the diffraction, the illuminated area of the photosensitive film is wider than the window 22. As a result, the photosensitive film pattern 23' is formed in which the chrome pattern 23' near the window 22 is exposed.

Figure 5D:
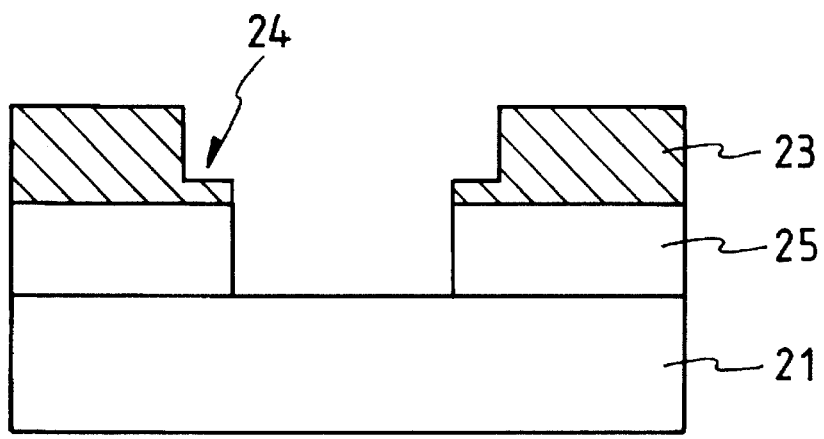

Finally, with reference to FIG. 5D, using the photosensitive film pattern 27 as a mask, the chrome pattern 23' is etched at a predetermined thickness, followed by the removal of the photosensitive film pattern 27, to form a step 24 near the window. As a result, the chrome pattern 23' is left at such a thickness as to permit penetration of only about 5 to 50% of the incident light.

As described hereinbefore, the half-tone type phase shift mask of the present invention which is prepared by a method broadly consisting of forming a phase shift pattern and a chrome pattern, both provided with a window on a transparent substrate, and etching the chrome pattern near the window at a predetermined thickness to form a step thick enough to permit penetration of thereunto about 5 to 50% of an incident beam of light illuminated on the half-tone type phase shift mask which can reduce the intensity of the passing-through light to zero at the edge area of the mask and at other areas rather than the window.

Therefore, the present invention can solve the problem that an undesired area may be exposed to light, and a photosensitive film pattern with a superior profile can be obtained by using the halftone type phase shift mask of the present invention. Such a photosensitive film pattern obtained can be used as a mask for etching or ion implantation, thereby preventing damage to a layer under the mask. Consequently, the half-tone type phase shift mask according to the present invention results in the improvement of the production yield and the reliability of a semiconductor device.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A process for the fabrication of a half-tone phase shift mask, comprising the steps of:

forming a phase shift layer on a transparent substrate;

forming a light screen on the phase shift layer;

selectively etching the light screen and the phase shift layer in sequence, to form a light screen pattern and a phase shift pattern, both provided with a window exposing a predetermined area of the transparent substrate; and removing the light screen pattern near said window at a predetermined thickness, to form a step near said window.

2. A process in accordance with claim 1, wherein said step of forming a step near said window comprises the steps of:

coating a positive photosensitive film on the light screen pattern;

exposing said positive photosensitive film to a beam of light incident from the backside of said substrate with both said light screen pattern and said phase shift pattern serving as a mask and said window being used as a slit from which said beam of light is so diffracted as to expose the wider area of said photosensitive film than that of said window;

removing the illuminated area of said photosensitive film through development, to form a photosensitive film pattern;

etching said light screen pattern at a predetermined thickness with said photosensitive film pattern serving as a mask; and eliminating the photosensitive film pattern.

3. A process in accordance with claim 1, wherein said step of said light screen is formed thick enough to permit penetration of about 5 to 50% of the light illuminated on said half-tone type phase shift mask.

4. A half-tone type phase shift mask, comprising:

a transparent substrate;

a phase shift pattern disposed on said substrate;

a chrome light screen pattern which is non-transmitting with respect to illuminated light used in a light exposure process, said phase shift pattern being between the chrome light screen pattern and the transparent substrate; and a window which passes through the chrome light screen pattern and the phase shift pattern to permit exposure of a predetermined area of said transparent substrate therethrough; wherein said chrome light screen pattern is provided with a step portion of reduced thickness near the window, the thickness of the step portion permitting penetration of about 5–50% of an incident beam of light directed to said phase shift mask during a light exposure process.

5. The phase shift mask of claim 4, wherein the substrate is quartz.

6. The phase shift mask of claim 4, wherein the phase shift pattern is formed of an oxide, nitride, or photo-sensitive material.

* * * * *